United States Patent
Kowal

(10) Patent No.: US 10,707,050 B2
(45) Date of Patent: Jul. 7, 2020

(54) SYSTEM AND METHOD TO DETECT GLITCHES

(71) Applicant: Varian Semiconductor Equipment Associates, Inc., Gloucester, MA (US)

(72) Inventor: Keith E. Kowal, Swampscott, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 16/046,159

(22) Filed: Jul. 26, 2018

(65) Prior Publication Data

US 2020/0035446 A1    Jan. 30, 2020

(51) Int. Cl.
| | |
|---|---|
| *H01J 37/24* | (2006.01) |
| *H03K 19/00* | (2006.01) |
| *H03M 1/12* | (2006.01) |
| *H01J 37/317* | (2006.01) |
| *H01L 21/265* | (2006.01) |

(52) U.S. Cl.
CPC .......... *H01J 37/24* (2013.01); *H01J 37/3171* (2013.01); *H01J 2237/24564* (2013.01); *H01L 21/265* (2013.01)

(58) Field of Classification Search
CPC ........... H01J 37/24; H03M 1/00; H03K 19/00
See application file for complete search history.

(56) References Cited

U.S. PATENT DOCUMENTS

| | | | |
|---|---|---|---|
| 5,170,359 A | 12/1992 | Sax et al. | |
| 5,740,064 A | 4/1998 | Witte et al. | |
| 6,094,622 A * | 7/2000 | Hubbard | G01R 21/133 702/61 |
| 7,005,657 B1 * | 2/2006 | Low | H01J 37/147 250/492.21 |
| 2004/0107909 A1 | 6/2004 | Collins et al. | |
| 2010/0148089 A1 | 6/2010 | Horsky et al. | |

(Continued)

FOREIGN PATENT DOCUMENTS

| | | |
|---|---|---|
| CN | 107831433 A | 3/2018 |
| TW | 201418729 A | 5/2014 |

OTHER PUBLICATIONS

TI Instruments 'Using the Stellaris Microcontroller Analog-to-digital Converter (ADC)—Application Note' Jun. 24, 2009 (Year: 2009).*

(Continued)

*Primary Examiner* — Eliza W Osenbaugh-Stewart
(74) *Attorney, Agent, or Firm* — Nields, Lemack & Frame, LLC

(57) ABSTRACT

A glitch monitoring system is disclosed. The glitch monitoring system allows the capture of voltage and current data from one or more channels. Additionally, voltage and current data that occurred prior to the glitch can also be captured for further analysis. The amount of data may be thousands or millions of bytes. Additionally, the description of a glitch, including an upper threshold, a lower threshold and a duration, can be programmed. This allows spurious perturbation in voltage or current to be ignored if desired. Further, the voltage and current data may be filtered if desired prior to being stored in memory. This data can later be retried by a main controller and analyzed to determine a potential cause of the glitch and potential remedial actions.

15 Claims, 7 Drawing Sheets

(56) References Cited

U.S. PATENT DOCUMENTS

2011/0314310 A1* 12/2011 Rajasekhar ........... G06F 1/3275
713/320
2015/0346246 A1* 12/2015 Tasher ............. G01R 19/16552
324/762.01
2016/0182074 A1   6/2016 Speir et al.

OTHER PUBLICATIONS

International Search Report and Written Opinion dated Oct. 28, 2019 in corresponding PCT application No. PCT/US2019/041297.

* cited by examiner

SYSTEM AND METHOD TO DETECT GLITCHES

FIELD

Embodiments of the present disclosure relate to systems and methods for detecting glitches, and more particularly storing information that occurs proximate the glitch in an ion implantation system.

BACKGROUND

The fabrication of a semiconductor device involves a plurality of discrete and complex processes. One such process may be an etch process, where material is removed from the workpiece. Another process may be a deposition process, wherein material is deposited on the workpiece. Yet another process may be an ion implantation process where ions are implanted into the workpiece.

To direct the ions along the desired path, a system with electrically biased components, such as electrodes, is used. Some of these electrodes are maintained at relatively high voltages. These electrodes may be disposed proximate to other components which may be at a very different voltage. This difference in voltage between nearby components may cause arcing or a glitch in the power supply to occur. These glitches may lead to defects or degraded performance in the workpieces being processed.

Understanding the cause of these glitches may be useful in correcting systemic problems. Thus, recording the events that immediately preceded and proceeded the glitch may be instrumental in diagnosing the system.

Therefore, it would be beneficial if there was a system and method for monitoring glitches and recording information that occurs immediately preceding and proceeding the glitch event. Further, it would be advantageous if the amplitude and duration of the glitch to be detected can be varied. Additionally, it would be advantageous if this information can be provided to a control system to analyze the information.

SUMMARY

A glitch monitoring system is disclosed. The glitch monitoring system allows the capture of voltage and current data from one or more channels. Additionally, voltage and current data that occurred prior to the glitch can also be captured for further analysis. The amount of data may be thousands or millions of bytes. Additionally, the description of a glitch, including an upper threshold, a lower threshold and a duration, can be programmed. This allows spurious perturbations in voltage or current to be ignored if desired. Further, the voltage and current data may be filtered if desired prior to being stored in memory. This data can later be retrieved by a main controller and analyzed to determine a potential cause of the glitch and potential remedial actions.

According to one embodiment, a glitch monitoring system is disclosed. The glitch monitoring system comprises an analog to digital conversion circuit for converting analog voltage and current signals to digital values; a trigger logic circuit comprising Glitch Window registers and a Glitch Duration register, wherein the Glitch Window registers establish an upper threshold and a lower threshold for the digital values, such that when a digital value is greater than the upper threshold or less than the lower threshold, a glitch is detected, and wherein the Glitch Duration register establishes a number of glitches that occur consecutively in order to cause a trigger; a memory in which the digital values are stored; and an address logic circuit, which saves an address of a location in memory at which the trigger occurs. In certain embodiments, the glitch monitoring system comprises a Post Trigger register, which establishes an amount of data to be stored in the memory after the trigger occurs. In certain embodiments, the glitch monitoring system comprises a data logic circuit, which manipulates the digital values prior to storing the digital values in the memory. In certain further embodiments, the digital values are passed through a low pass filter prior to being stored in the memory. In certain further embodiments, the digital values are passed through a high pass filter prior to being stored in the memory. In certain further embodiments, the digital values are passed through a fast Fourier Transform prior to being stored in the memory. In some embodiments, the analog to digital conversion circuit comprises a Sample Rate register to determine a frequency at which the analog voltage and current signals are converted to digital signals. In certain embodiments, the analog to digital conversion circuit comprises a Sample Type register, wherein the digital values may represent raw data or averaged data, based on information stored in the Sample Type register.

According to another embodiment, a glitch monitoring system is disclosed. The glitch monitoring system comprises an analog to digital conversion circuit for converting analog voltage and current signals to digital values, wherein the analog to digital conversion circuit comprises a Sample Rate register to determine a frequency and period at which the analog voltage and current signals are converted to digital values and a Sample Type register, wherein the digital values may represent raw data or averaged data, based on information stored in the Sample Type register, wherein when averaged data is used, the analog to digital conversion circuit performs a plurality of measurements during each period and generates an average of the plurality of measurements as the digital value; a trigger logic circuit for determining a trigger; a memory in which the digital values are stored; and an address logic circuit, which saves an address of a location in memory at which the trigger occurs. In certain embodiments, the glitch monitoring system comprises a data logic circuit, which manipulates the digital values prior to storing the digital values in the memory. In certain further embodiments, the digital values are passed through a low pass filter prior to being stored in the memory. In certain further embodiments, the digital values are passed through a high pass filter prior to being stored in the memory. In certain further embodiments, the digital values are passed through a fast Fourier Transform prior to being stored in the memory.

According to another embodiment, a glitch monitoring system is disclosed. The glitch monitoring system comprises an analog to digital conversion circuit for converting analog voltage and current signals to digital values; a trigger logic circuit for determining a trigger; a memory in which the digital values are stored; a data logic circuit, which manipulates the digital values prior to storing the digital values in the memory; and an address logic circuit, which saves an address of a location in memory at which the trigger occurs. In certain further embodiments, the digital values are passed through a low pass filter prior to being stored in the memory. In certain further embodiments, the digital values are passed through a high pass filter prior to being stored in the memory. In certain further embodiments, the digital values are passed through a fast Fourier Transform prior to being stored in the memory.

According to another embodiment, an ion implanter is disclosed. The ion implanter comprises an ion source; an electrically biased component; a power supply to provide voltage and current signals to the electrically biased component; and any of the glitch monitoring systems described above, wherein the analog voltage and current signals are monitored by the glitch monitoring system.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
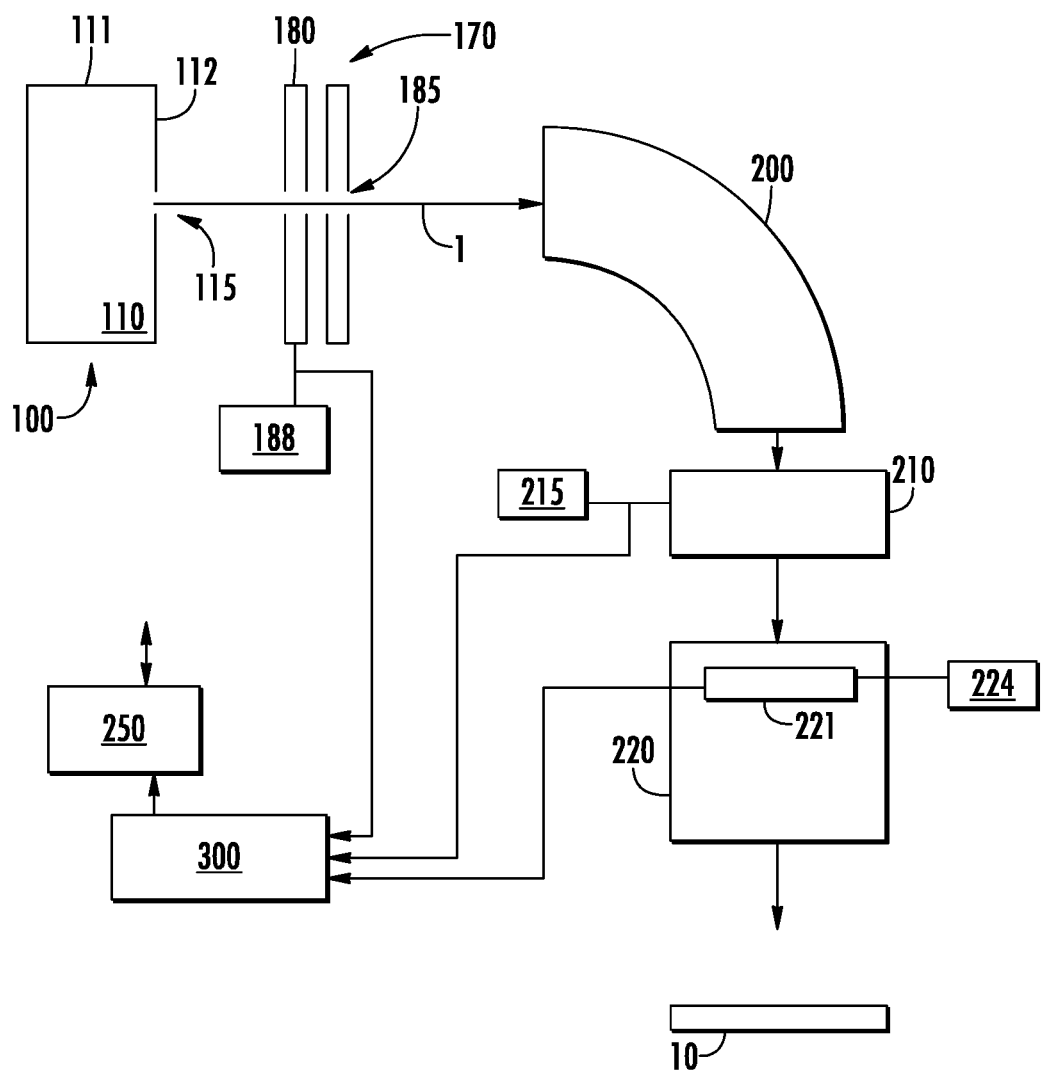
FIG. 1 is a representative view of a semiconductor system with a glitch monitoring system according to one embodiment.

FIG. 1 shows a first embodiment of a semiconductor processing system that may be used with the glitch monitoring system described in this disclosure. The semiconductor processing system includes an ion source 100 comprising a plurality of chamber walls 111 defining an ion source chamber 110. In certain embodiments, the ion source 100 may be an RF ion source. In this embodiment, an RF antenna may be disposed against a dielectric window. This dielectric window may comprise part or all of one of the chamber walls 111. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 kW and may be any suitable frequency, such as between 1 and 15 MHz. Further, the power supplied by the RF power supply may be pulsed.

In another embodiment, a cathode is disposed within the ion source chamber 110. A filament is disposed behind the cathode and energized so as to emit electrons. These electrons are attracted to the cathode, which in turn emits electrons into the ion source chamber 110. This cathode may be referred to as an indirectly heated cathode (IHC), since the cathode is heated indirectly by the electrons emitted from the filament.

Other embodiments are also possible. For example, the plasma may be generated in a different manner, such as by a Bernas ion source or a capacitively coupled plasma (CCP) source. The manner in which the plasma is generated is not limited by this disclosure.

One chamber wall, referred to as the extraction plate 112, includes an extraction aperture 115. The extraction aperture 115 may be an opening through which the ions generated in the ion source chamber 110 are extracted and directed toward a workpiece 10. The extraction aperture 115 may be any suitable shape. In certain embodiments, the extraction aperture 115 may be oval or rectangular shaped, having one dimension, referred to as the length, which may be much larger than the second dimension, referred to as the height.

In certain embodiments, all of the chamber walls 111 and the extraction plate 112 are electrically conductive. In other embodiments, only the extraction plate 112 is electrically conductive and in communication with a bias power supply. The remaining chamber walls 111 may be made of a dielectric material.

Disposed outside and proximate the extraction aperture 115 are extraction optics 170. In certain embodiments, the extraction optics 170 comprises one or more electrodes 180. Each electrode 180 may be a single electrically conductive component with an aperture 185 disposed therein. Alternatively, each electrode 180 may be comprised of two electrically conductive components that are spaced apart so as to create the aperture 185 between the two components. The electrodes 180 may be a metal, such as titanium. One or more of the electrodes 180 may be electrically connected to ground. In certain embodiments, one or more of the electrodes 180 may be biased using an electrode power supply 188. The electrode power supply 188 may be used to bias one or more of the electrodes 180 relative to the ion source chamber 110 so as to attract ions through the extraction aperture 115. The extraction aperture 115 and the aperture 185 are aligned.

While FIG. 1 shows two electrodes 180, in other embodiments, the extraction optics 170 may be more complex. For example, the extraction optics 170 may include one or more additional electrodes. The configuration of the extraction optics 170 may vary and is not limited by this disclosure. Furthermore, although one electrode power supply 188 is shown, it is understood that multiple electrode power supplies 188 may also be employed.

Located downstream from the extraction optics 170 may be a mass analyzer 200. The mass analyzer uses magnetic fields to guide the path of the extracted ions. The mass analyzer 200 comprises a resolving aperture at its distal end. Only those ions that have a selected mass and charge will be directed through the resolving aperture.

The ion implantation system may also comprise a first acceleration/deceleration stage 210. The first acceleration/deceleration stage 210 is used to manipulate the energy of the ion beam by either decelerating the ion beam, or accelerating the ion beam. This may be achieved by applying a bias voltage to the electrodes that comprise the first acceleration/deceleration stage 210. A stage power supply 215 may be used to supply the bias voltage to the first acceleration/deceleration stage 210.

Downstream of the first acceleration/deceleration stage 210 may be a second acceleration/deceleration stage 220. The second acceleration/deceleration stage 220 is a beamline lens component configured to independently control deflection, deceleration, and focus of the ion beam. For example, the second acceleration/deceleration stage 220 may be a vertical electrostatic energy filter (VEEF) or electrostatic filter (EF). The second acceleration/deceleration stage 220 may include an electrode configuration comprising one or more electrodes 221. The one or more electrodes 221 may be in communication with a respective power supply. For purposes of clarity, only one VEEF power supply 224 is shown.

In operation, feed gas from a gas storage container is introduced to the ion source chamber 110 through a gas inlet. The feed gas is energized, causing the creation of a plasma. Ions in that plasma are typically positively charged. Because the electrodes 180 are biased relative to the chamber walls 111 and the extraction plate 112, the ions exit the extraction aperture 115 in the form of an ion beam 1. The ion beam 1 passes through the extraction aperture 115, the aperture 185, the mass analyzer 200, the first acceleration/deceleration stage 210 and the second acceleration/deceleration stage 220 and travels toward the workpiece 10.

A main controller 250 is also used to control the system. The main controller 250 has a processing unit and an associated memory device. This memory device contains the instructions, which, when executed by the processing unit, enable the system to perform the functions described herein. This memory device may be a non-volatile memory, such as a FLASH ROM, an electrically erasable ROM or other suitable devices. In other embodiments, the memory device may be a volatile memory, such as a RAM or DRAM. In certain embodiments, the main controller 250 may be a general purpose computer, an embedded processor, or a specially designed microcontroller. The actual implementation of the main controller 250 is not limited by this disclosure.

The main controller 250 may be in communication with each of the power supplies and may also be in communication with each of the electrically biased components, so that the main controller 250 can control and monitor the actual voltage being applied to each of the electrically biased components. The electrically biased components include the electrodes 180, the first acceleration/deceleration stage 210 and the second acceleration/deceleration stage 220. For example, the main controller 250 may monitor the actual voltage being applied to the electrodes 180 in the extraction optics 170, the first acceleration/deceleration stage 210 and the second acceleration/deceleration stage 220. If the voltage is not within a range that is acceptable, the main controller 250 may determine that a fault has occurred.

In many ion implantation systems, glitches may occur. A glitch may occur when a high voltage component, such as a biased electrode, discharges to a grounded component, such as a ground electrode, a mechanical support or other component. For example, the extraction optics 170 may include a first electrode that is grounded, and a second electrode that is biased at a high voltage. If particles form on these electrodes, arcing may occur between these electrodes.

Therefore, in certain embodiments, it may be beneficial to produce a trace that shows the voltage and current of one or more biased components as a function of time. This trace may be in the form of a table that includes time, current and voltage. Further, it may be advantageous to include information prior to the glitch and after the glitch.

A glitch monitoring system 300 is used to record information related to the voltage and current being applied to one or more biased electrically components. A channel is defined as the voltage and current associated with one electrically biased component. The glitch monitoring system 300 can monitor one or more channels simultaneously. In some embodiments, the glitch monitoring system 300 may monitor four or more channels simultaneously.

Figure 2:
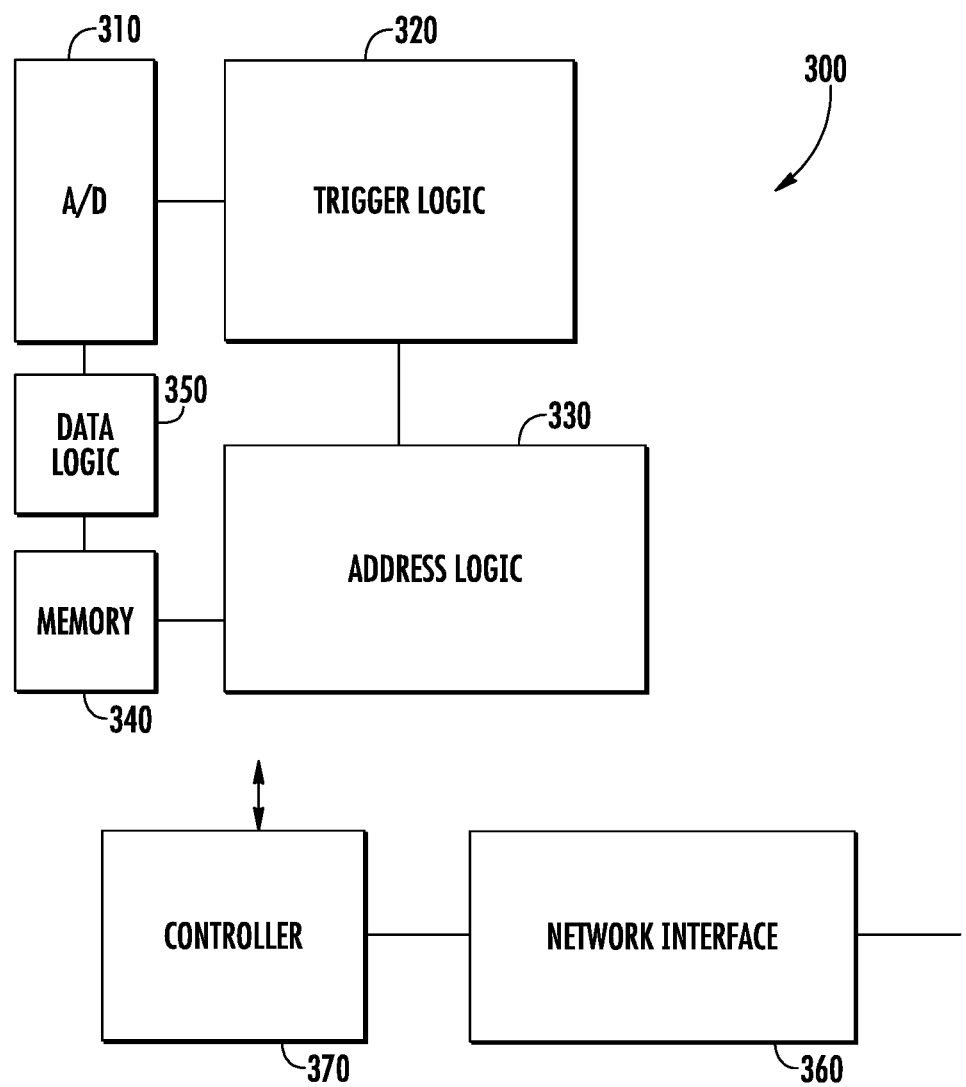
FIG. 2 is a representative view of the system for monitoring glitches according to one embodiment.

FIG. 2 shows the glitch monitoring system 300 according to one embodiment. Conceptually, the glitch monitoring system 300 comprises an analog to digital (A/D) conversion circuit 310, a trigger logic circuit 320, an address logic circuit 330, a memory 340, a data logic circuit 350, a network interface 360, and a local controller 370. Each of these circuits will be described in more detail below.

Figure 3:
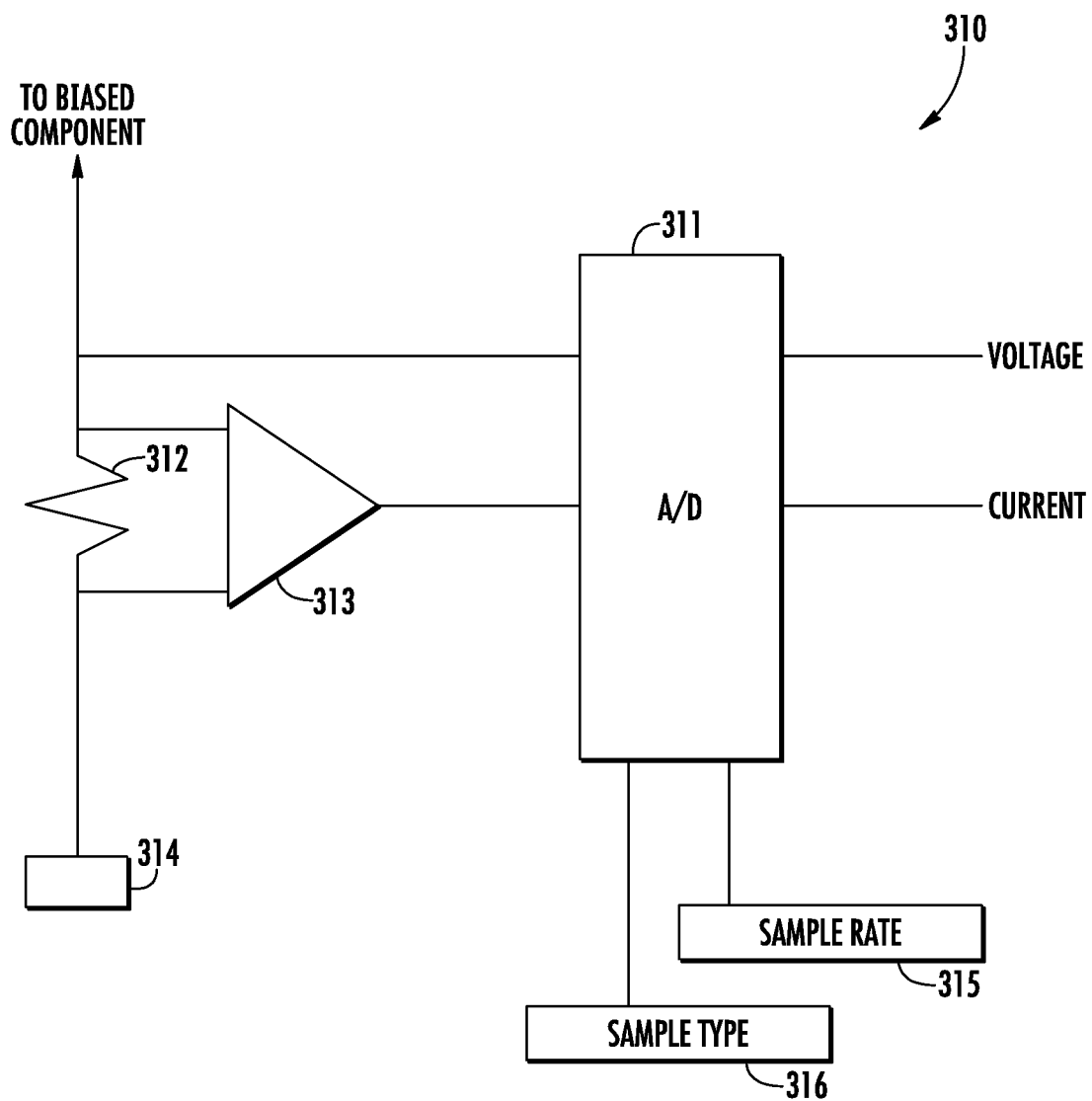
FIG. 3 shows a representative block diagram of the analog to digital conversion circuit according to one embodiment.

FIG. 3 shows a representative block diagram of the analog to digital (A/D) conversion circuit 310. The analog to digital (A/D) conversion circuit 310 comprises one or more analog/digital converters (ADC) 311. In some embodiments, a current resistor 312 is disposed between a power supply 314, such as electrode power supply 188, stage power supply 215, or VEEF power supply 224 and its respective electrically biased component. The voltage measured across this current resistor 312 is representative of the current supplied to the biased resistor. Thus, in some embodiments, a differential amplifier 313 is in communication with opposite ends of the current resistor 312. The output of the differential amplifier 313 and the output of the current resistor 312 may be input to the ADC 311. In another embodiment, the ADC 311 receives the voltage signal and the current signal directly from the power supply 314. In this embodiment, current resistor 312 and differential amplifier 313 are not employed. The ADC 311 converts these analog voltages into digital values. The ADC 311 may sample these analog voltages at a predetermined rate, known as the sampling rate. In certain embodiment, the sampling rate may be programmed by the local controller 370 using Sample Rate register 315. For example, the sampling rate may be between once per 1 microsecond and once per 8.192 milliseconds. Of course, in other embodiments, other sampling rates may be used. Thus, the outputs of the analog to digital (A/D) conversion circuit 310 comprises a digital value representing the current supplied to an electrically biased component and a digital value representing the voltage supplied to that electrically biased component. These two values together may be referred to as a channel. In certain embodiments, the analog to digital (A/D) conversion circuit 310 may comprise a plurality of ADC 311 or may multiplex a single ADC 311 to perform conversions for a plurality of channels.

In certain embodiments, the analog to digital (A/D) conversion circuit 310 may comprise a Sample Type register 316. The Sample Type register 316 may select between raw data and averaged data. In other words, if the sample rate is every 1 microsecond and the Sample Type register 316 indicated raw data, the ADC 311 will perform a conversion every microsecond. If the sample rate is every 1 microsecond and the Sample Type register 316 indicated averaged data, the ADC 311 will perform a plurality of conversions during that 1 microsecond time duration and present the average value as its output.

Figure 4:
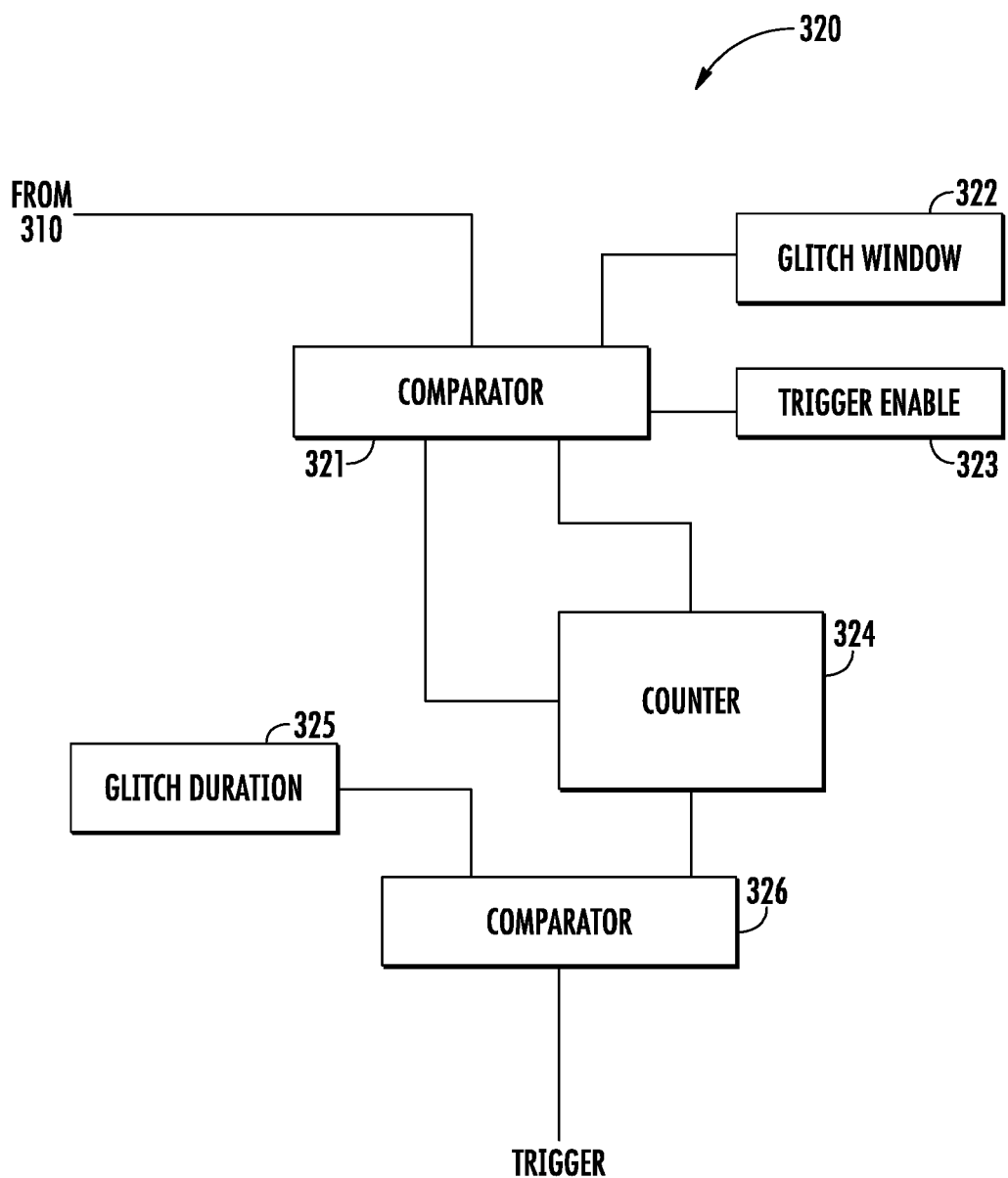
FIG. 4 shows a representative block diagram of the trigger circuit according to one embodiment.
Figure 5:
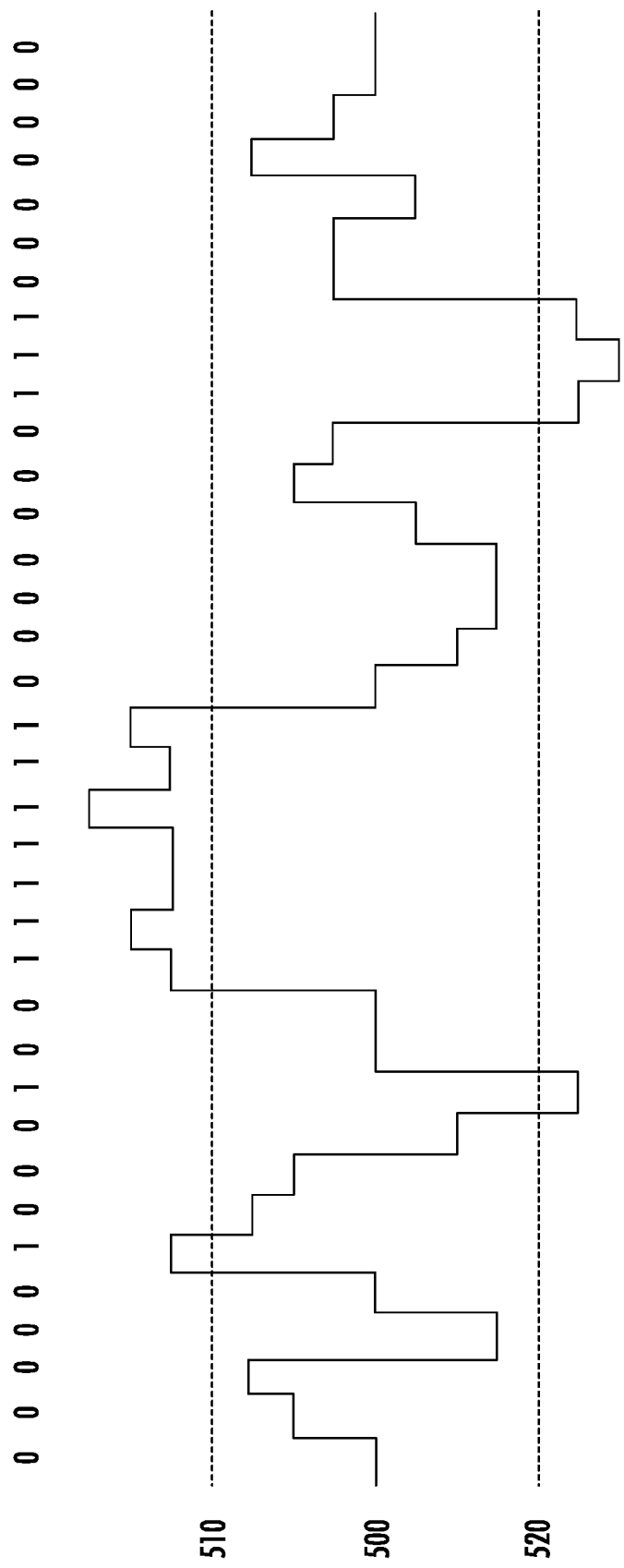
FIG. 5 shows a waveform with upper and lower thresholds shown.

The outputs from the analog to digital (A/D) conversion circuit 310 may serve as inputs to the trigger logic circuit 320 and the address logic circuit 330. FIG. 4 shows a representative block diagram of the trigger logic circuit 320. The output of the analog to digital (A/D) conversion circuit 310 may be used as an input to a comparator 321. The comparator 321 is also in communication with one or more Glitch Window registers 322. The Glitch Window registers 322 establish the upper thresholds and lower thresholds that define a glitch of the voltage, the current or both. For example, FIG. 5 shows a representative diagram showing a voltage waveform 500. The value above which a glitch is detected, is set by upper threshold 510. The value below which a glitch is detected, is set by lower threshold 520. As long as the voltage waveform 500 remains between the upper threshold 510 and the lower threshold 520, no glitches are detected. Thus, the comparator 321 outputs a "0" when the voltage waveform is between the upper threshold 510 and the lower threshold 520, and outputs a "1" when the voltage waveform 500 is outside these thresholds. The output of the comparator is shown in FIG. 5. These upper and lower thresholds may be programmed by the local controller 370 and stored in the Glitch Window register 322. In some embodiments, the Glitch Window register 322 may be used to hold separate upper thresholds and lower thresholds for the voltage and current values. The comparator 321 may also be in communication with a Trigger Enable register 323. The Trigger Enable register 323 is used to determine which values (i.e. voltage and/or current) are to be monitored to determine whether a glitch occurs. In other words, in some scenarios, the comparator 321 may monitor only the voltage values from the analog to digital (A/D) conversion circuit 310 to detect glitches. In certain scenarios, the comparator 321 may monitor only the current values from the analog to digital (A/D) conversion circuit 310 to detect glitches. In yet other scenarios, the comparator 321 may monitor both the voltage and current values from the analog to digital (A/D) conversion circuit 310 to detect glitches. Thus, if the Trigger Enable register 323 indicates that the voltage is to be monitored, and the voltage value is above the upper threshold or below the lower threshold, the comparator 321 will output a "1".

In certain embodiments, the output of the comparator 321 may be used as an input to a counter 324. In one embodiment, the counter 324 increments whenever the output from the comparator 321 is a "1" and resets whenever the output from the comparator 321 is a "0". Thus, in the example shown in FIG. 5, the counter will reach a value of 1 for the first and second glitches, a value of 7 for the third glitch, and a value of 3 for the fourth glitch. In certain embodiments, a Glitch Duration register 325 is used. This Glitch Duration register 325 specifies the minimum duration of a glitch. For example, if the Glitch Duration register 325 is set to a value of 3, then the first and second glitches would not cause the trigger. However, the third and fourth glitches would cause the trigger. To perform this function, the contents of the Glitch Duration register 325 is compared to the value of the counter 324. If the value of the counter 324 is equal to or greater than the contents of the Glitch Duration register 325, the output of the comparator 326 is asserted, causing a trigger to occur.

Figure 6:
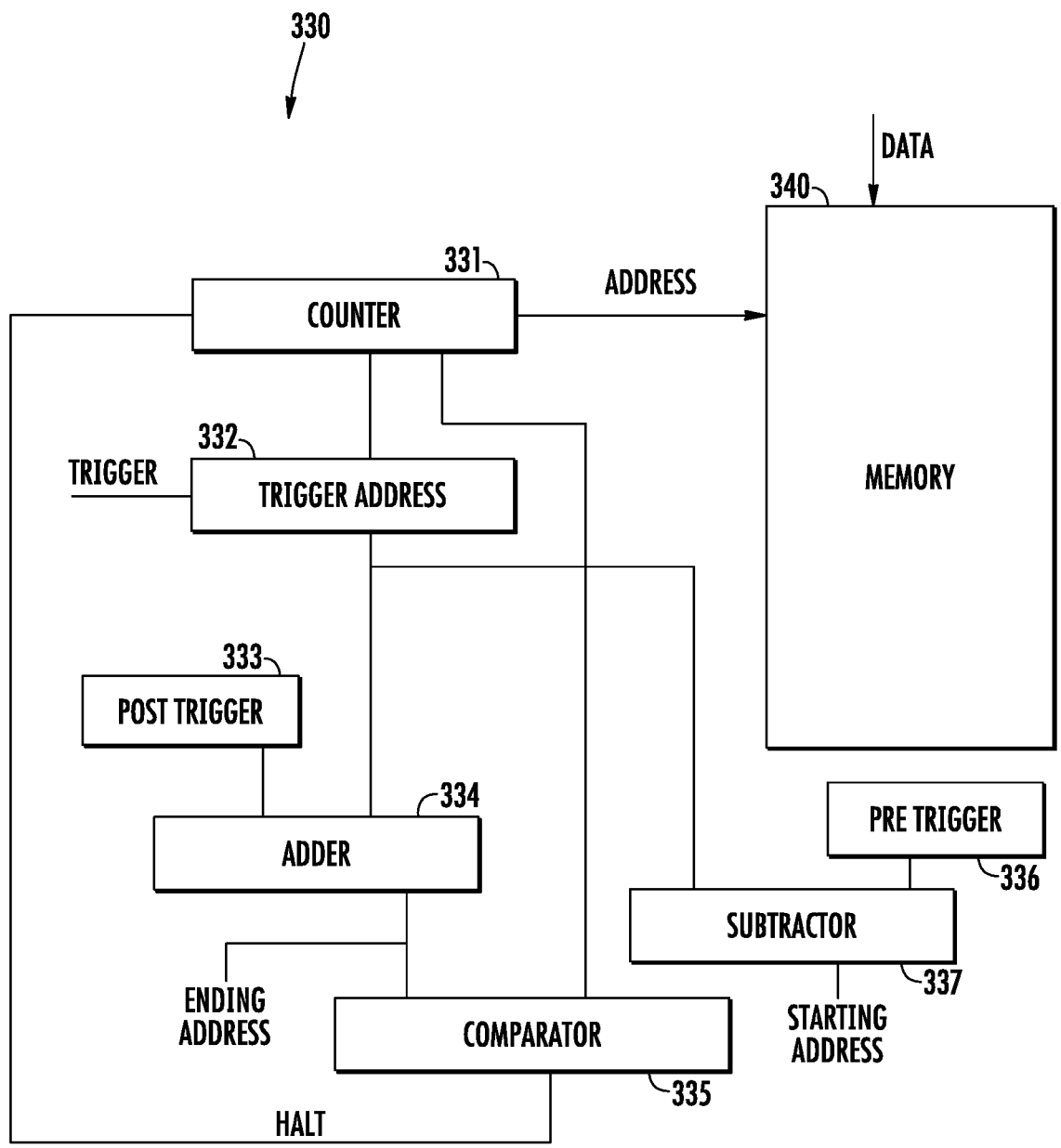
FIG. 6 shows a representative block diagram of the address logic circuit according to one embodiment.

The trigger is used to control the data that is written into the memory 340. Once the local controller 370 initializes the glitch monitoring system 300, the glitch monitoring system 300 begins writing information into the memory 340. FIG. 6 shows a representative block diagram of the address logic circuit 330.

An address counter 331 is used to index into the memory 340. The address counter 331 increments whenever data is written into the memory 340. Note that data is written into the memory 340 even before the trigger occurs to allow storage of data that preceded the trigger. As long as the trigger has not occurred, the address counter 331 continues incrementing. If the entire memory 340 is filled, the address counter 331 resets to 0 and starts overwriting previous written data. When the trigger occurs, the current value of the address counter 331 is stored in the Trigger Address register 332. This Trigger Address register 332 stores the address in memory where the trigger occurred. Additionally, the address logic circuit 330 may include a Post Trigger register 333, which represents the amount of data to be stored after the trigger occurs. This Post Trigger register 333 may represent the number of blocks of data to be stored after the trigger occurs. Blocks of data can be organized in any desired size, such as 2048 bytes, 4096 bytes, 8192 bytes, or any other suitable size. The value in the Post Trigger register 333 is then added to the Trigger Address register 332 using adder 334. This sum represents the ending address that should be stored by the memory 340. Thus, the value of the address counter 331 is compared to this sum using comparator 335. If these values are the same, the address counter 331 is halted and no more data is stored in the memory 340. If these values are different, the address counter 331 continues incrementing and storing more data. Additionally, the address logic circuit 330 may include a Pre Trigger register 336 which indicates the amount of data that is to be stored prior to the trigger. The value in the Pre Trigger register 336 is subtracted from the Trigger Address register 332 using Subtractor 337 to yield the starting address in memory. Thus, the data that is stored as a result of a trigger event begins at the starting address and terminates at the ending address. Thus, when the local controller 370 reads data from the memory 340, the data is bounded by these two addresses.

Thus, the address logic circuit 330 allows a programmable or configurable amount of data to be stored before and after a trigger event occurs.

Figure 7:
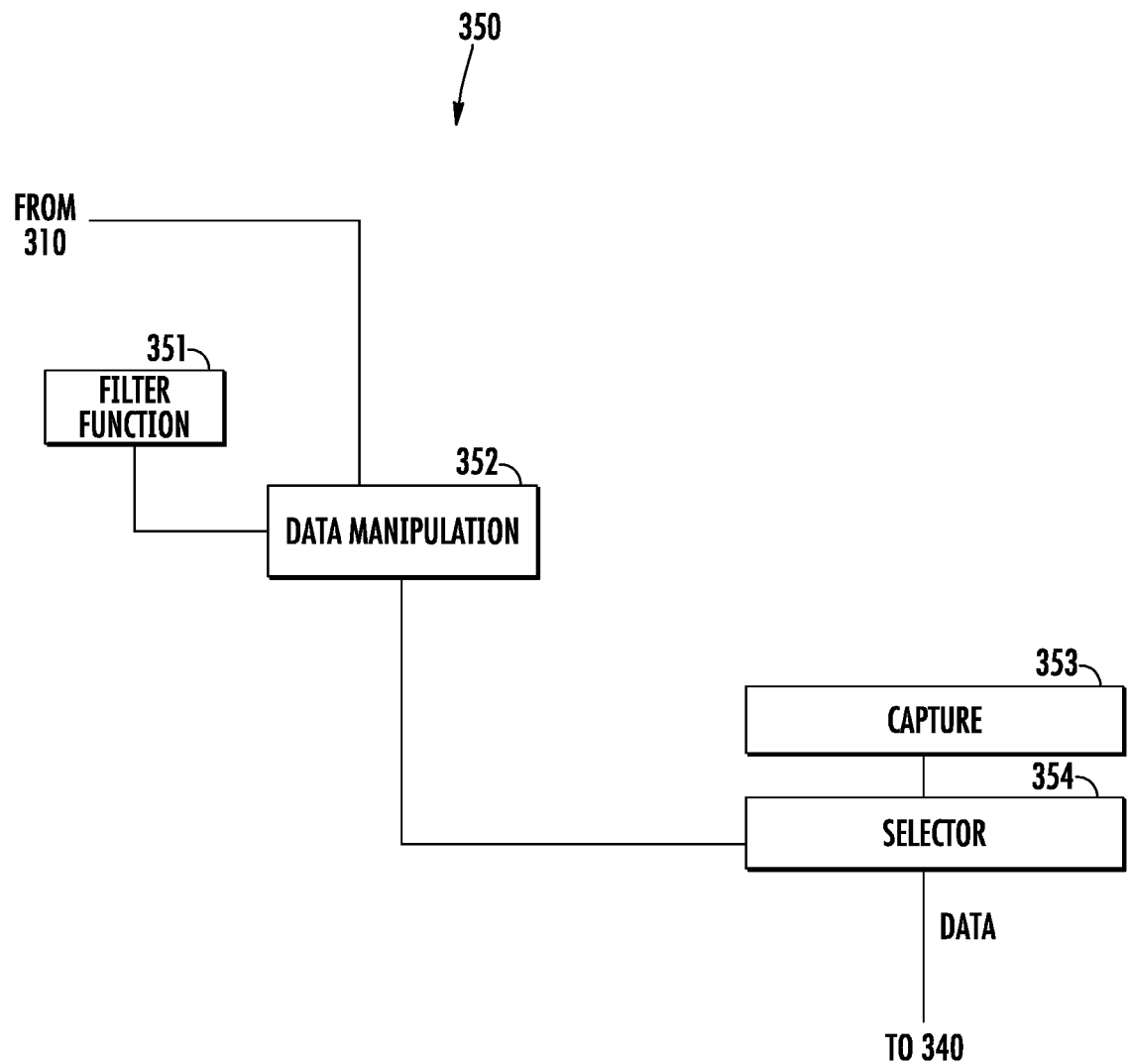
FIG. 7 shows a representative block diagram of the data logic circuit according to one embodiment.

In certain embodiments, the glitch monitoring system 300 may include a data logic circuit 350, such as the one shown in FIG. 7. The data logic circuit 350 is responsible for manipulating the data presented by the analog to digital (A/D) conversion circuit 310 before it is stored in the memory 340. The data logic circuit 350 may include one or more Filter Function registers 351. The Filter Function registers 351 allow the local controller 370 to determine how the raw data presented by the analog to digital (A/D) conversion circuit 310 should be manipulated prior to being stored in memory 340. In certain embodiments, the raw data is not altered, and simply passes through the data manipulation circuit 352. In another instance, the raw data is passed through a low pass filter, disposed in the data manipulation circuit 352, prior to be presented to the memory 340. In certain embodiments, the cutoff frequency of the low pass filter may also be stored in the Filter Function register 351. In another instance, the raw data is passed through a high pass filter, disposed in the data manipulation circuit 352, prior to be presented to the memory 340. In certain embodiments, the cutoff frequency of the high pass filter may also be stored in the Filter Function register 351. In yet another embodiment, a Fast Fourier Transform (FFT) may be performed by the data manipulation circuit 352. The results of the FFT are presented to the memory 340. The results of the FFT may include a plurality of data bytes that contain frequency and amplitude information. All of this information may be stored in the memory 340.

The data logic circuit 350 may include a Capture register 353 that indicates what data should be stored in the memory 340. In certain instances, only voltage data is stored. In other instances, only current data is stored. In yet other instances, both voltage and current data are stored. Conceptually, a selector 354 is in communication with the data from the analog to digital (A/D) conversion circuit 310 and the Capture register 353. The selector 354 determines what data is presented to the memory 340. Thus, the data logic circuit 350 allows the actual voltage and current data to be manipulated by the local controller 370.

In one embodiment, the selector 354 may be used to multiply the voltage value and the current value so that power values can be stored in the memory 340. In another embodiment, the data manipulation circuit 352 performs the multiplication operation to generate the power value. In these embodiments, the Capture register 353 may contain a bit that denotes that power values should be stored in the memory 340.

The glitch monitoring system 300 may also include a network interface 360. In certain embodiments, the network interface 360 may comprise an EtherCat controller. The EtherCat controller may be used to transmit data, such as the stored data from memory 340 to other devices, such as the main controller 250. In other embodiments, a different network controller, such as an EtherNet controller, a WiFi controller, an RS-232 controller or another, may be employed.

Additionally, the glitch monitoring system 300 comprises a local controller 370. The local controller has a processing unit and an associated memory device. This memory device contains the instructions, which, when executed by the processing unit, enable the glitch monitoring system to perform the functions described herein. This memory device may be a non-volatile memory, such as a FLASH ROM, an electrically erasable ROM or other suitable devices. In other embodiments, the memory device may be a volatile memory, such as a RAM or DRAM. In certain embodiments, the local controller 370 may be a general purpose computer, an embedded processor, or a specially designed microcontroller. The actual implementation of the local controller 370 is not limited by this disclosure. The glitch monitoring system 300 is designed such that the local controller 370 is able to access internal signals within the other circuits. For example, one or more of the other circuits have been described as having registers that the local controller 370 may access. In certain embodiments, at least some of the registers are read/write, meaning that the local controller 370 is able to read the contents of the register and is also able to modify its contents. Some of the registers may be read only, indicating that the local controller 370 may access the contents of the register but cannot modify the contents of the register. Other registers may be write only, indicating that the local controller 370 may only modify the contents, but cannot read the register.

In operation, the local controller 370 may initialize the glitch monitoring system 300. This may be performed by writing values into at least some of the following registers: Sample Rate register 315, the Sample Type register 316, the Glitch Window registers 322, the Glitch Duration register 325, the Trigger Enable register 323, The Post Trigger register 333, the Pre Trigger register 336, the Filter Function register 351 and the Capture register 353. In certain embodiments, the Trigger Enable register 323 is written last, as this serves to arm the glitch monitoring system 300. In other embodiments, a separate register or register bit is used to arm the system. Once the glitch monitoring system 300 is armed, it will begin storing data, as described above. Once the trigger conditions are met, the address logic circuit 330 continues incrementing the address until the amount of data indicated in the Post Trigger register 333 has been stored.

After the data has been captures, the local controller 370 may read the stored data. In one embodiment, the local controller 370 may read a register contained within the data logic circuit 350 that provides the local controller 370 with the next data word stored in the memory 340. This data may be presented as parallel or serial data. In another embodiment, the local controller 370 may be able to access the memory 340 directly.

The system and method described herein have many advantages. The glitch monitoring system allows customization of many parameters, including the upper and lower thresholds for a glitch, and the duration of a glitch used to create a trigger. This allows precision triggering of the system in order to capture the desired data. Further, the glitch monitoring system also allows customization of the sampling of the analog signals, including variation in sample type and sample rate. Additionally, the glitch monitoring system allows manipulation of the digital values before they are stored in memory. This manipulation may allow further analysis of the data. Advantageously, this glitch monitoring system may be used with an ion implanter, such that it is capable of monitoring one or more power supplies during operation.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A glitch monitoring system, comprising:
   an analog to digital conversion circuit for converting analog voltage and current signals to digital values;
   a trigger logic circuit comprising:
   Glitch Window registers and a Glitch Duration register, wherein the Glitch Window registers establish an upper threshold and a lower threshold for the digital values, such that when a digital value is greater than the upper threshold or less than the lower threshold, a glitch is detected, and wherein the Glitch Duration register establishes a number of glitches that occur consecutively in order to cause a trigger;
   a first comparator for comparing the digital values to the upper threshold and the lower threshold;
   a counter in communication with an output of the first comparator to count the number of glitches; and
   a second comparator for comparing an output of the counter to the Glitch Duration register to create the trigger;
   a memory in which the digital values are stored; and
   an address logic circuit, which saves an address of a location in memory at which the trigger occurs, referred to as a Trigger Address.

2. The glitch monitoring system of claim 1, further comprising a Post Trigger register, which establishes an amount of data to be stored in the memory after the trigger occurs, wherein a sum of a value of the Post Trigger register and the Trigger Address defines an ending address.

3. The glitch monitoring system of claim 2, further comprising a Pre Trigger register, which establishes an amount of data to be stored in the memory before the trigger occurs, wherein a value in the Pre Trigger register is subtracted from the Trigger Address to determine a starting address, and wherein data of interest stored in memory is bounded by the starting address and the ending address.

4. The glitch monitoring system of claim 1, further comprising a data logic circuit, which manipulates the digital values prior to storing the digital values in the memory.

5. The glitch monitoring system of claim 4, wherein the digital values are passed through a low pass filter prior to being stored in the memory.

6. The glitch monitoring system of claim 4, wherein the digital values are passed through a high pass filter prior to being stored in the memory.

7. The glitch monitoring system of claim 4, wherein the digital values are passed through a fast Fourier Transform prior to being stored in the memory.

8. The glitch monitoring system of claim 1, wherein the analog to digital conversion circuit comprises a Sample Rate register to determine a frequency at which the analog voltage and current signals are converted to digital signals.

9. The glitch monitoring system of claim 1, wherein the analog to digital conversion circuit comprises a Sample Type register, wherein the digital values may represent raw data or averaged data, based on information stored in the Sample Type register.

10. An ion implanter, comprising:
an ion source;
an electrically biased component;
a power supply to provide voltage and current signals to the electrically biased component; and
the glitch monitoring system of claim 1, wherein the analog voltage and current signals are monitored by the glitch monitoring system.

11. An ion implanter, comprising:
an ion source;
an electrically biased component;
a power supply to provide voltage and current signals to the electrically biased component; and
a glitch monitoring system wherein the analog voltage and current signals are monitored by the glitch monitoring system; wherein the glitch monitoring system comprises:
an analog to digital conversion circuit for converting analog voltage and current signals to digital values, wherein the analog to digital conversion circuit comprises a Sample Rate register to determine a frequency and period at which the analog voltage and current signals are converted to digital values and a Sample Type register, wherein the digital values may represent raw data or averaged data, based on information stored in the Sample Type register, wherein when averaged data is used, the analog to digital conversion circuit performs a plurality of measurements during each period and generates an average of the plurality of measurements as the digital value;
a trigger logic circuit for determining a trigger;
a memory in which the digital values are stored; and
an address logic circuit, which saves an address of a location in memory at which the trigger occurs.

12. The ion implanter of claim 11, further comprising a data logic circuit, which manipulates the digital values prior to storing the digital values in the memory.

13. The ion implanter of claim 12, wherein the digital values are passed through a low pass filter prior to being stored in the memory.

14. The ion implanter of claim 12, wherein the digital values are passed through a high pass filter prior to being stored in the memory.

15. The ion implanter of claim 12, wherein the digital values are passed through a fast Fourier Transform prior to being stored in the memory.

* * * * *